US009865478B2

(12) United States Patent
Tsai et al.

(10) Patent No.: US 9,865,478 B2
(45) Date of Patent: Jan. 9, 2018

(54) SHIELDING DESIGN FOR METAL GAP FILL

(71) Applicant: Taiwan Semiconductor Manufacturing Co., Ltd., Hsin-Chu (TW)

(72) Inventors: Ming-Chin Tsai, Hsinchu (TW); Bo-Hung Lin, Kaohsiung (TW); You-Hua Chou, Taipei (TW); Chung-En Kao, Miaoli County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 211 days.

(21) Appl. No.: 14/589,091

(22) Filed: Jan. 5, 2015

(65) Prior Publication Data

US 2015/0118843 A1    Apr. 30, 2015

Related U.S. Application Data

(62) Division of application No. 13/355,770, filed on Jan. 23, 2012, now Pat. No. 8,926,806.

(51) Int. Cl.
*C23C 14/00* (2006.01)
*H01L 21/324* (2006.01)
(Continued)

(52) U.S. Cl.
CPC ............ *H01L 21/324* (2013.01); *C23C 14/50* (2013.01); *C23C 14/541* (2013.01);
(Continued)

(58) Field of Classification Search
CPC .................................................. C23C 14/541
See application file for complete search history.

(56) References Cited

U.S. PATENT DOCUMENTS 3,294,670 A    12/1966   Charschan et al.
4,874,723 A    10/1989   Jucha et al.
(Continued)

FOREIGN PATENT DOCUMENTS

CN    101008074 A    8/2007
CN    201785480 U    4/2011
(Continued)

OTHER PUBLICATIONS

Non-Final Office Action dated Nov. 8, 2013 in connection with U.S. Appl. No. 13/355,770.
(Continued)

*Primary Examiner* — Timon Wanga
(74) *Attorney, Agent, or Firm* — Eschweiler & Potashnik, LLC

(57) ABSTRACT

The present disclosure is directed to a physical vapor deposition system configured to heat a semiconductor substrate or wafer. In some embodiments the disclosed physical vapor deposition system comprises at least one heat source having one or more lamp modules for heating of the substrate. The lamp modules may be separated from the substrate by a shielding device. In some embodiments, the shielding device comprises a one-piece device or a two piece device. The disclosed physical vapor deposition system can heat the semiconductor substrate, reflowing a metal film deposited thereon without the necessity for separate chambers, thereby decreasing process time, requiring less thermal budget, and decreasing substrate damage.

20 Claims, 8 Drawing Sheets

(51) Int. Cl.
  *H01L 21/67* (2006.01)
  *C23C 14/54* (2006.01)
  *C23C 14/58* (2006.01)
  *C23C 14/50* (2006.01)
  *H01L 21/768* (2006.01)

(52) U.S. Cl.
  CPC .... *C23C 14/5806* (2013.01); *H01L 21/67115* (2013.01); *H01L 21/76838* (2013.01)

(56) References Cited

U.S. PATENT DOCUMENTS

| | | |
|---|---|---|
| 5,556,472 A | 9/1996 | Nakamura et al. |
| 5,622,607 A * | 4/1997 | Yamazaki ........... C23C 14/0036 204/192.15 |
| 5,693,199 A | 12/1997 | Bourez et al. |
| 5,900,391 A * | 5/1999 | Sakakibara ....... C04B 35/62218 204/192.24 |
| 6,030,510 A | 2/2000 | Kobayashi et al. |
| 6,238,533 B1 | 5/2001 | Satitpunwaycha et al. |
| 6,589,865 B2 | 7/2003 | Dixit et al. |
| 7,182,816 B2 | 2/2007 | Kleshock et al. |
| 7,378,002 B2 | 5/2008 | Lee et al. |
| 7,949,237 B2 | 5/2011 | Koren et al. |
| 2005/0039679 A1 | 2/2005 | Kleshock et al. |
| 2005/0148200 A1* | 7/2005 | Kijima .................. C23C 14/568 438/761 |
| 2008/0116067 A1* | 5/2008 | Lavitsky ................ C23C 14/35 204/298.12 |
| 2012/0231633 A1* | 9/2012 | Ewert .................. C23C 14/541 438/763 |

FOREIGN PATENT DOCUMENTS

| | | |
|---|---|---|
| KR | 20020089592 A | 11/2002 |
| KR | 20060065703 A | 6/2006 |

OTHER PUBLICATIONS

Final Office Action dated May 7, 2014 in connection with U.S. Appl. No. 13/355,770.
Notice of Allowance dated Aug. 29, 2014 in connection with U.S. Appl. No. 13/355,770.

* cited by examiner

SHIELDING DESIGN FOR METAL GAP FILL

CROSS-REFERENCE TO RELATED APPLICATION

This application is a Divisional Patent Application of U.S. patent application Ser. No. 13/355,770 filed Jan. 23, 2012 entitled "Shielding Design for Metal Gap Fill" and is hereby incorporated in its entirety.

BACKGROUND

Integrated chips are formed by complex fabrication processes, during which a workpiece is subjected to different steps to form one or more semiconductor devices. Some of the processing steps may comprise formation of a thin film onto the semiconductor substrate. Thin films can be deposited onto a semiconductor substrate in a low pressure processing chamber using physical vapor deposition.

Physical vapor deposition is typically performed by acting on a target material to convert the target into a vapor. Often, a target material is acted upon by a plasma comprising a plurality of high energy ions. The high energy ions collide with the target material, dislodging particles into the vapor. The vapor is transported to a semiconductor substrate, upon which the vapor accumulates to form a thin film.

DETAILED DESCRIPTION

Figure 1A:
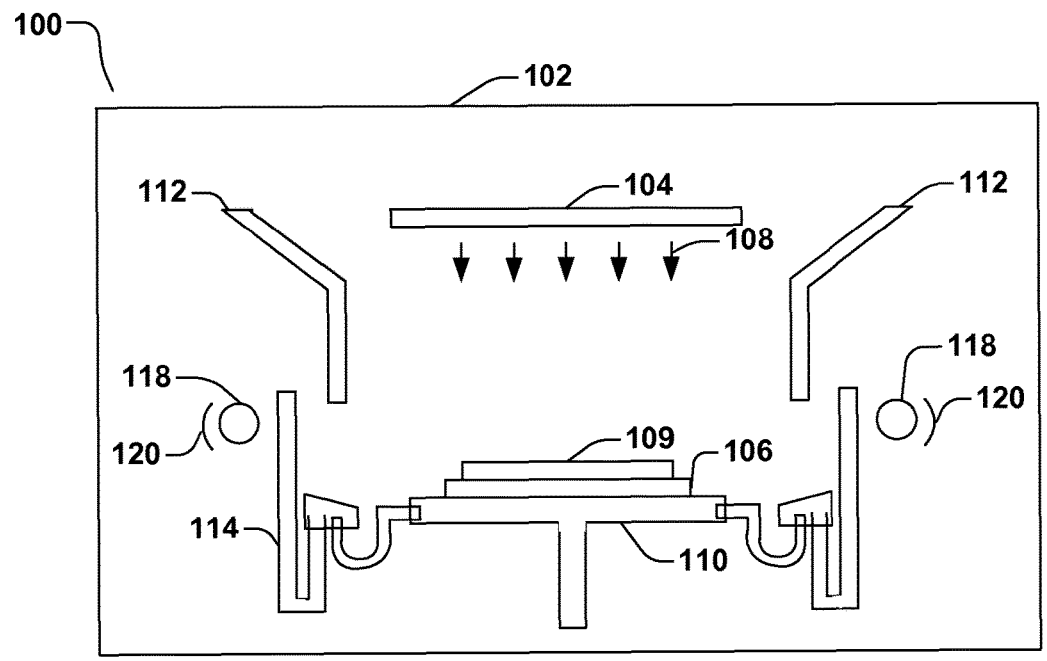
FIGS. 1A-1C illustrates a cross-sectional view of a physical vapor deposition system in accordance with an embodiment of the disclosure.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Modern semiconductor devices generally involve multiple layers separated by dielectric (insulating) layers, often referred to simply as an oxide layer. The layers are electrically interconnected by holes penetrating the intervening oxide layer which contact some underlying conductive feature. After the holes are etched, they are filled with a metal, such as aluminum or copper, to electrically connect the bottom layer with the top layer. The generic structure is referred to as a plug.

Filling such a hole with a metal elicits certain difficulties, including filling the hole without forming an included void. Any included void decreases the conductivity through the plug and introduces reliability issues. Physical vapor deposition ("PVD") or sputtering, is one of the most commonly used processes for filling of these openings owing to its fast deposition rates. PVD is a plasma process performed in a vacuum process chamber where a negatively biased target with respect to a chamber body or a grounded sputter shield is exposed to a plasma of a gas mixture comprising gases such as inert gases (e.g., argon (Ar)). Bombardment of the target by ions of the inert gas results in ejection of atoms of the target material. In some case, a magnetron is positioned in the back of the target to project a magnetic field parallel to the front side of the target to trap electrons and increase plasma density and sputtering rate. The ejected atoms accumulate as a deposited film on a substrate placed on a substrate pedestal disposed within the process chamber.

PVD, however, does not inherently conformally coat a deep and narrow opening. One approach for applying PVD to deep openings is to sputter the metal on a hot substrate so that the deposited material naturally flows into the narrow and deep feature. This process is typically referred to as reflow. However, high temperature reflow, e.g, greater than 400° C., results in a high thermal budget, as well as being detrimental to previously formed layers on the device and often requires the use of more than one chamber, thereby increasing processing time owing to the necessity of having to move the wafer from one chamber to another.

Accordingly, the present disclosure is directed to a physical vapor deposition system configured to heat a semiconductor substrate or wafer. In some embodiments the disclosed physical vapor deposition system comprises at least one heat source having one or more lamp modules configured to reflow a metal film deposited on the substrate. The lamp modules may be thermally separated from the substrate by a shielding device. In some embodiments, the shielding device comprises a one-piece device or a two piece device. The disclosed physical vapor deposition system can heat the semiconductor substrate, reflowing a metal film deposited thereon without the necessity for separate chambers, thereby decreasing process time, requiring less thermal budget, and decreasing substrate damage.

In general, embodiments of the disclosure contemplate the heat source be defined by one or more lamp modules which include a plurality of individual lamps emitting a wavelength of light in the visible spectrum. Lamps create a rapid isothermal processing system that provide instantaneous energy, typically requiring a very short and well controlled start up period. The lamps may include, for example, high intensity discharge lamps, incandescent lamps, gas discharge lamps, and electron-stimulated lamps, among others. The lamps may be turned on and off quickly, such as when a wafer temperature set point is reached. The lamps may be controlled variably by adjusting the power supplied by a power controller, thereby increasing or decreasing the radiant energy being emitted by any of the lamps. Additionally, each lamp modules may have multiple zones made up of a plurality of individual lamps. In this manner, the light energy emitted by each module may be controlled by turning single or multiple zones in the lamp modules on or off. The lamps will generally range in power from about 1 k Watts to about 100 k Watts, capable of very rapid wafer heating, for example, from 0° C. up to 700° C. in ten seconds. Lamp light angle may also be adjusted to control wafer temperature.

As shown in FIG. 1A, there is illustrated a first embodiment of a physical vapor deposition system including a processing chamber 100 defined by chamber walls 102. A pedestal 110, which is usually temperature-controlled, is configured to support a wafer or other semiconductor substrate 106 to be sputter coated 108. A PVD target 104 configured to provide target atoms is positioned within the chamber 100 in opposition to the substrate 106 being sputter coated 108 with a layer of a PVD metal film 109. The metal film 109 will generally be aluminum or copper. A two-piece shielding device comprising an upper shielding portion 112 and a lower shielding portion 114 protects the chamber walls 102 and the sides of the pedestal 110 from sputter deposition, as well as thermally separating a heat source from the substrate. For aluminum sputtering, for example, at least the front face of the target 104 facing the substrate 106 is composed of aluminum or aluminum alloy. A controllable chiller 116 may circulate chilled water or other refrigerated liquid to a cooling channel (not shown) formed in the pedestal 110. At least one heat source comprising one or more lamp modules 118 is positioned adjacent to the lower portion 114 of shielding and between lower shielding 114 and chamber wall 102. One or more reflecting devices 120 are associated with each lamp module in order to assist in directing the light energy being emitted by lamp modules 118 onto the substrate 106. Reflecting devices 120 may include a reflector or set of reflectors. Reflecting devices 120 can be made from any material suitable for reflecting light energy and can have any suitable shape that will assist in directing the light energy emitted by lamp modules 118 toward the substrate 106. Reflecting devices 120 may be adjustable such that the path of the light emitted from the lamp modules may be changed.

Figure 1B:
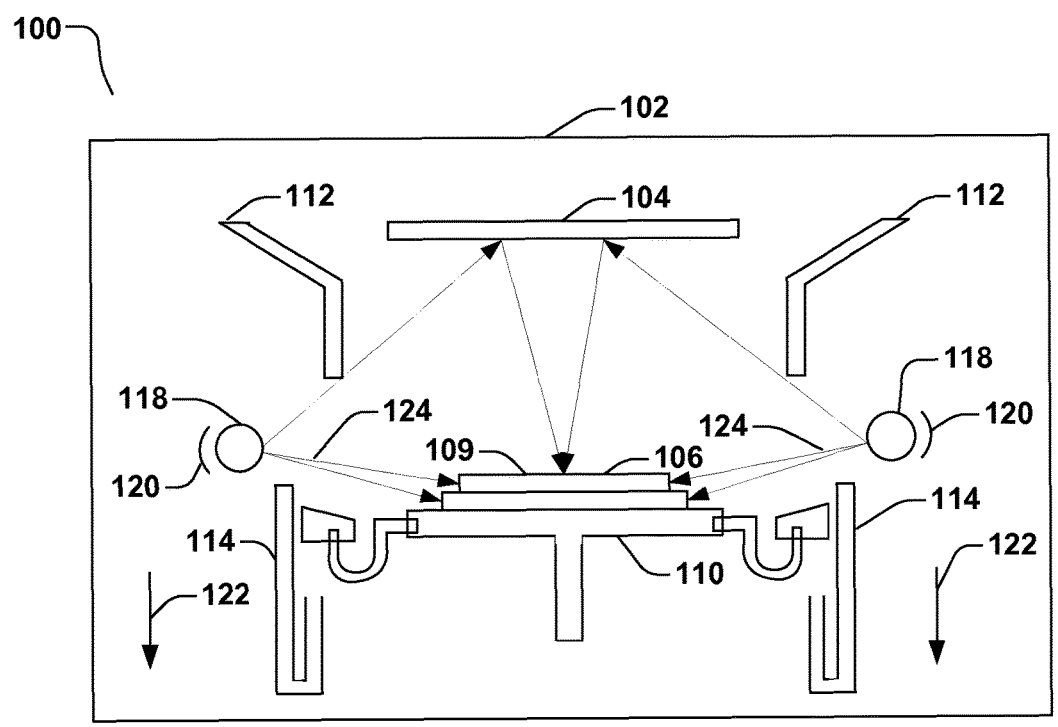

During operation of the chamber 100 following sputter coating 108 of the substrate 106, a rapid thermal process is initiated to heat the substrate 106 and reflow the sputtered coating 108. As illustrated in FIG. 1B, shielding lower portion 114 is moved in a downward direction as indicated by arrows 122, exposing lamp modules 118. The lamp modules 118 may be electrically connected to each other and controlled by a control system, which controls when each of the various radiant heat sources is illuminated. Control system is typically, but not limited to, a computer processing system such as a PC or workstation. As illustrated in FIG. 1B, lamp modules 118 are partially surrounded by a reflecting device 120. Light energy 124 emitted by lamp modules 118 is directed onto wafer by reflecting devices 120.

Figure 1C:
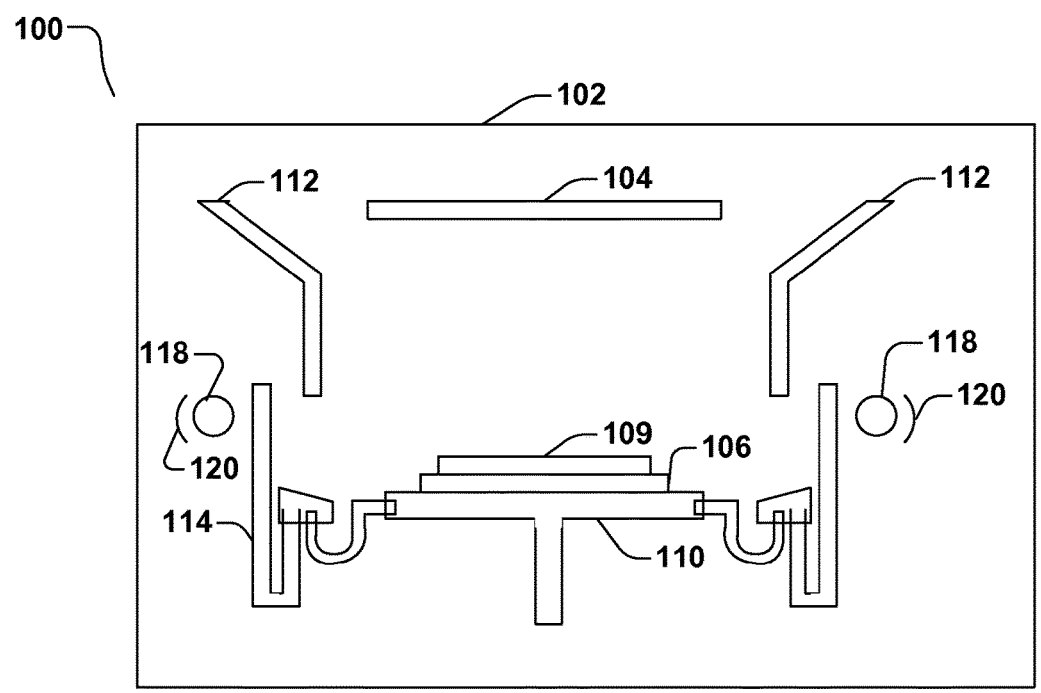

After a predetermined time, lamp modules 118 may be turned off and shielding lower portion 114 is raised, as illustrated in FIG. 1C. Substrate 106 is then cooled by circulation of chilled water or other refrigerated liquid through pedestal 110.

Figure 2A:
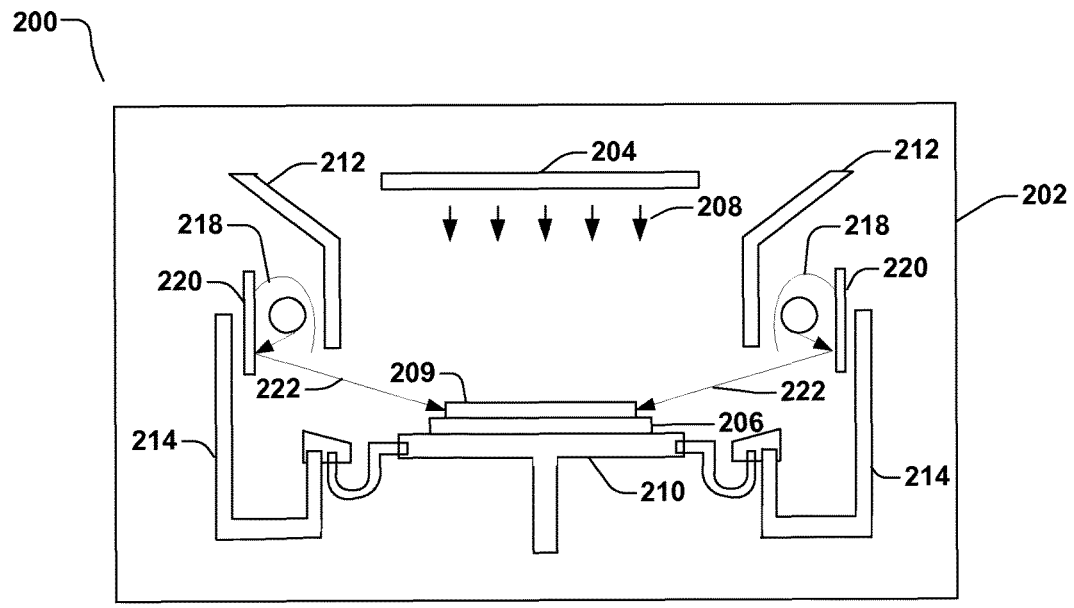
FIGS. 2A-2B illustrates a cross-sectional view of a further embodiment of a physical vapor deposition system.
Figure 2B:
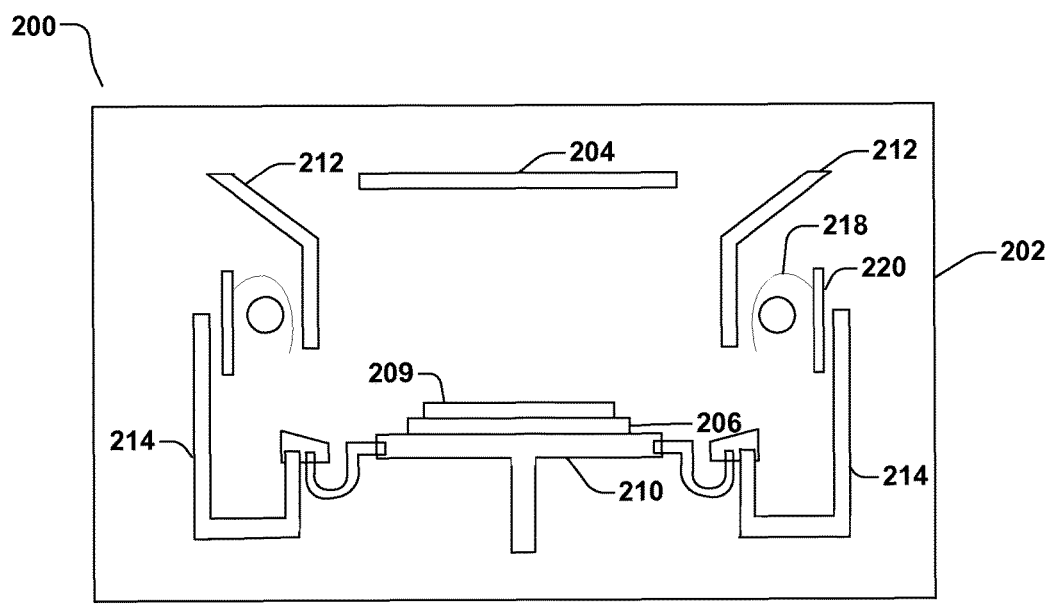

In FIG. 2A there is illustrated a further embodiment of the physical vapor deposition system disclosed herein. System includes a processing chamber 200 formed by chamber walls 202. One or more lamp modules 218 are positioned between upper shielding portion 212 and lower shielding portion 214. Lamp modules 218 include a reflecting device 220. Reflecting device 220 focuses light energy 222 emitted by lamp modules 218 to surface of substrate 206 held on pedestal 210, and reflow metal film 209 thereon. Following reflow of the metal film 209, lamp modules 218 may be turned off. The substrate 206 is then cooled through pedestal 210 as illustrated in FIG. 2B.

Figure 3A:
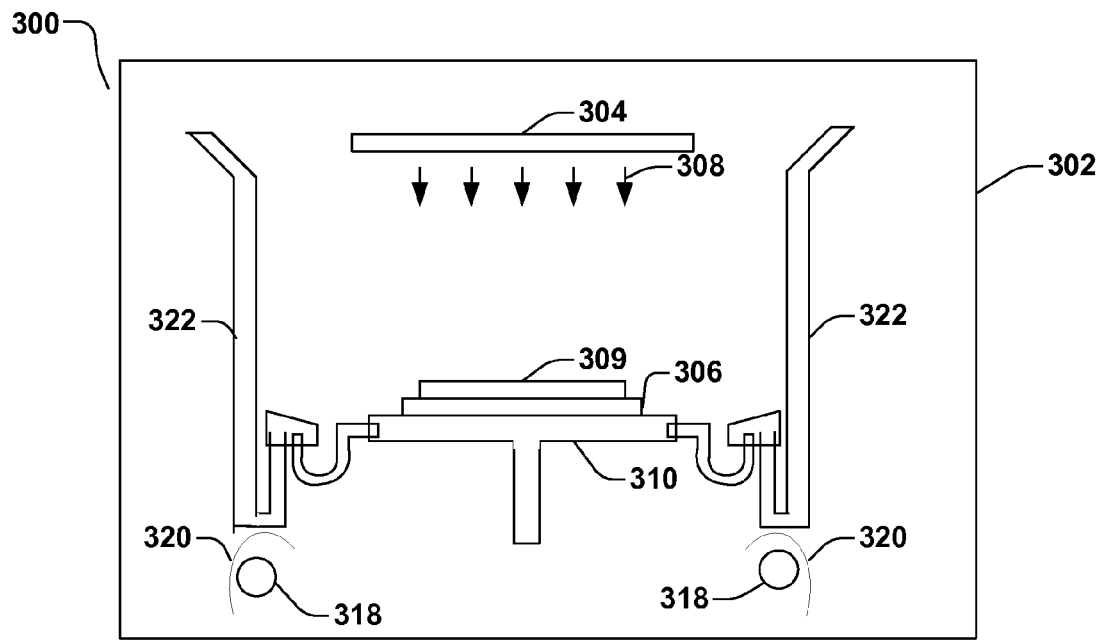
FIGS. 3A-3C illustrates a cross-sectional view of a physical vapor deposition system having a one-piece shielding design.
Figure 3B:
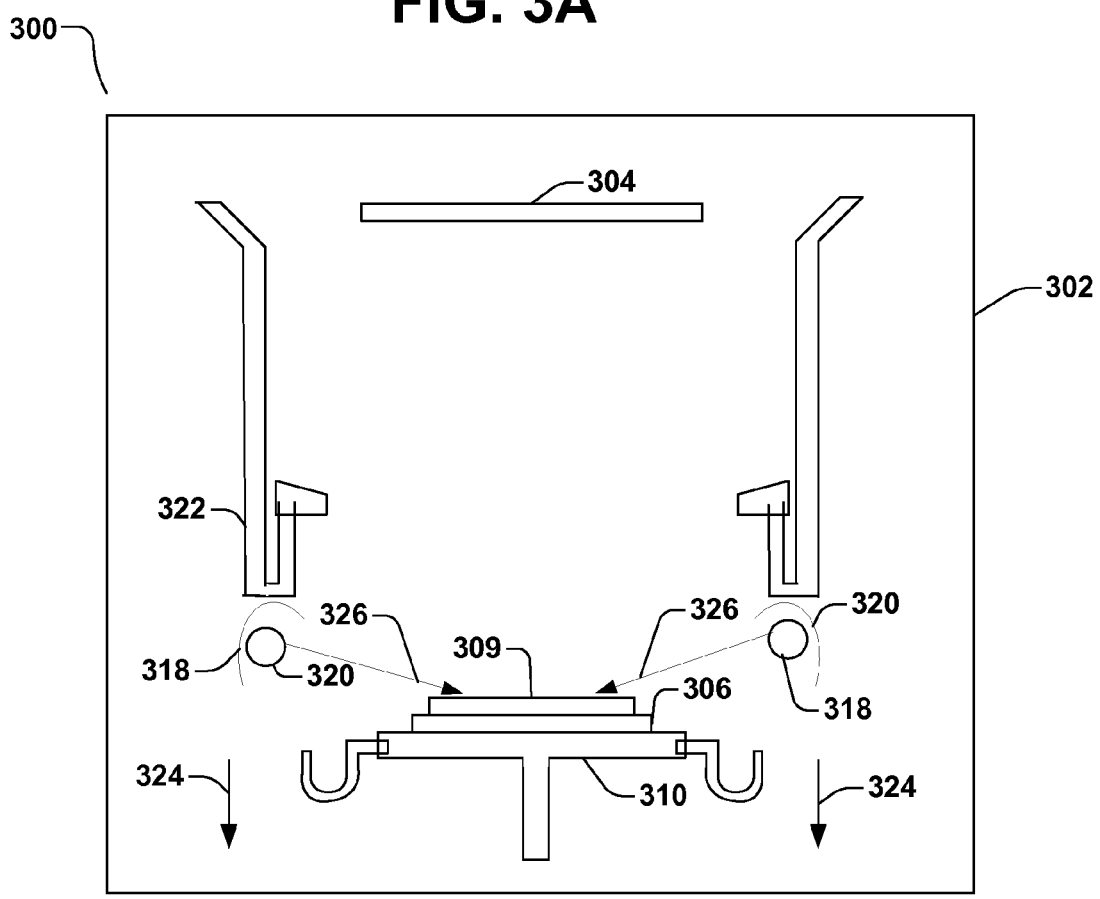
Figure 3C:
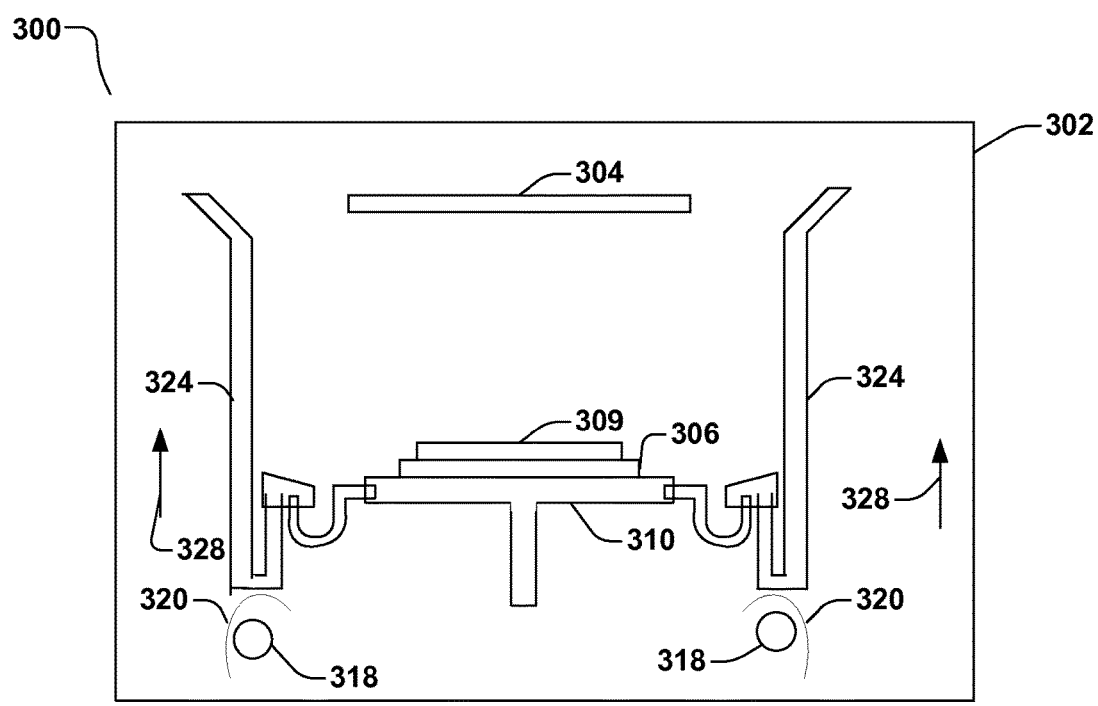

A further embodiment of the physical vapor deposition system disclosed herein is illustrated in FIG. 3A. In this embodiment, lamp modules 318 are positioned below a one-piece shielding device 322 within chamber walls 302. Following sputtering 308 of target atoms from target 304 onto substrate 306 to form film 309, pedestal 310 is lowered as shown by directional arrows 324 in FIG. 3B. A reflow of the metal film 309 is accomplished by rapid thermal heating by lamp modules 318. Light energy 326 emitted by lamp modules 318 may be reflected from reflecting device 320 and directed to surface of substrate 306. Upon completion of the reflow process, the lamp modules may be turned off and the pedestal is raised as indicated by directional arrows 328 in FIG. 3C. Substrate 306 is then cooled by circulation of chilled water or other refrigerated liquid through pedestal 310.

Figure 4A:
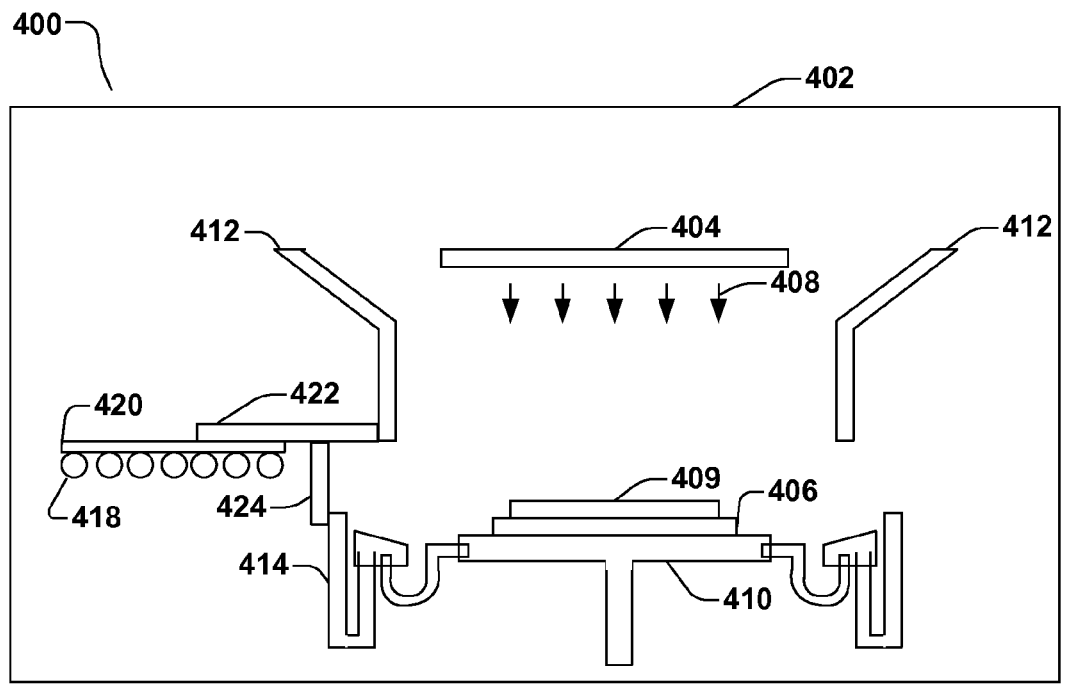
FIG. 4A-4C illustrates a cross-sectional view of an embodiment of a physical vapor deposition system having a rotateably moveable transfer arm.

FIG. 4A illustrates a still further embodiment of the physical vapor deposition system disclosed herein. In FIG. 4A, lamp modules 418 are supported on a mounting bracket 420. Mounting bracket 420 is affixed to a rotateably moveable transfer arm 422. Transfer arm 422 may be housed in a side chamber (not shown). Transfer arm can be rotated into processing chamber 400 through slit valve 424.

Figure 4B:
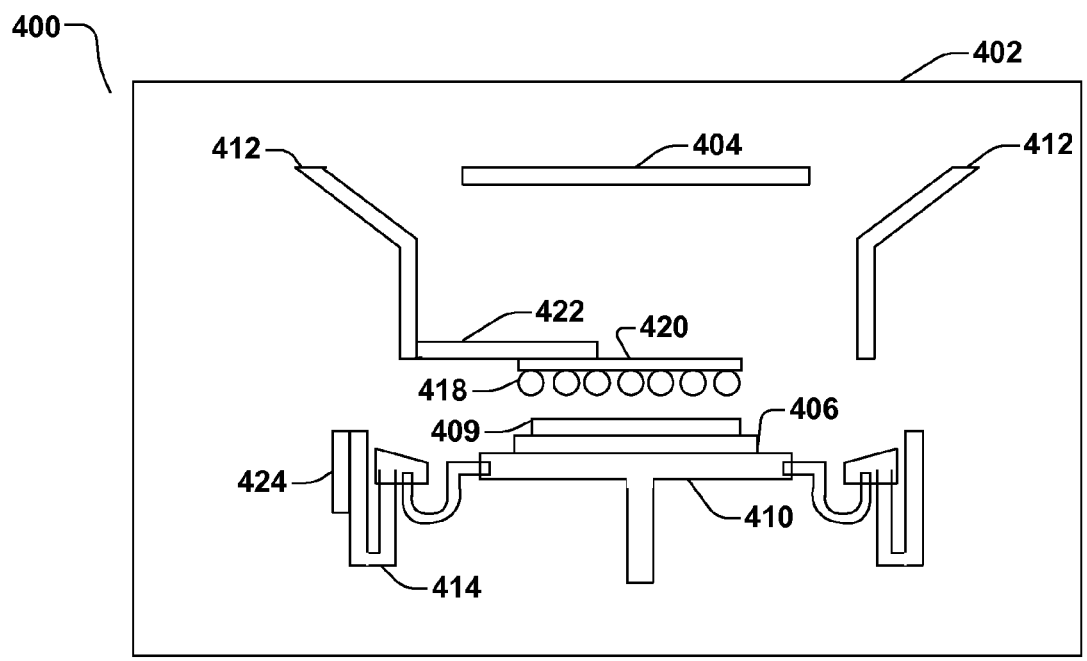
Figure 4C:
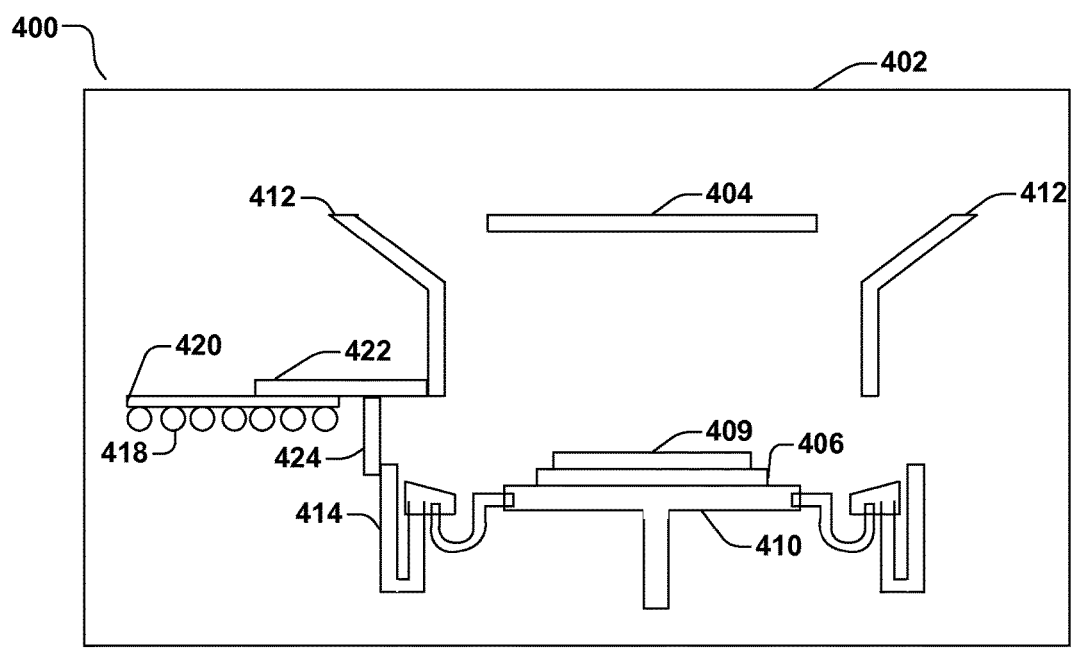

In FIG. 4B, slit valve 424 opens and transfer arm 422 rotates to move lamp modules 418 on mounting bracket 420 into position above metal film 409 on substrate 406. Lamp modules 418 are turned on and substrate 406 is heated to reflow metal film 409. After a predetermined time, lamp modules 418 are turned off and transfer arm 422 rotates to remove lamp modules from processing chamber 400 as illustrated in FIG. 4C. Substrate 406 is then cooled through pedestal 410.

Figure 5:
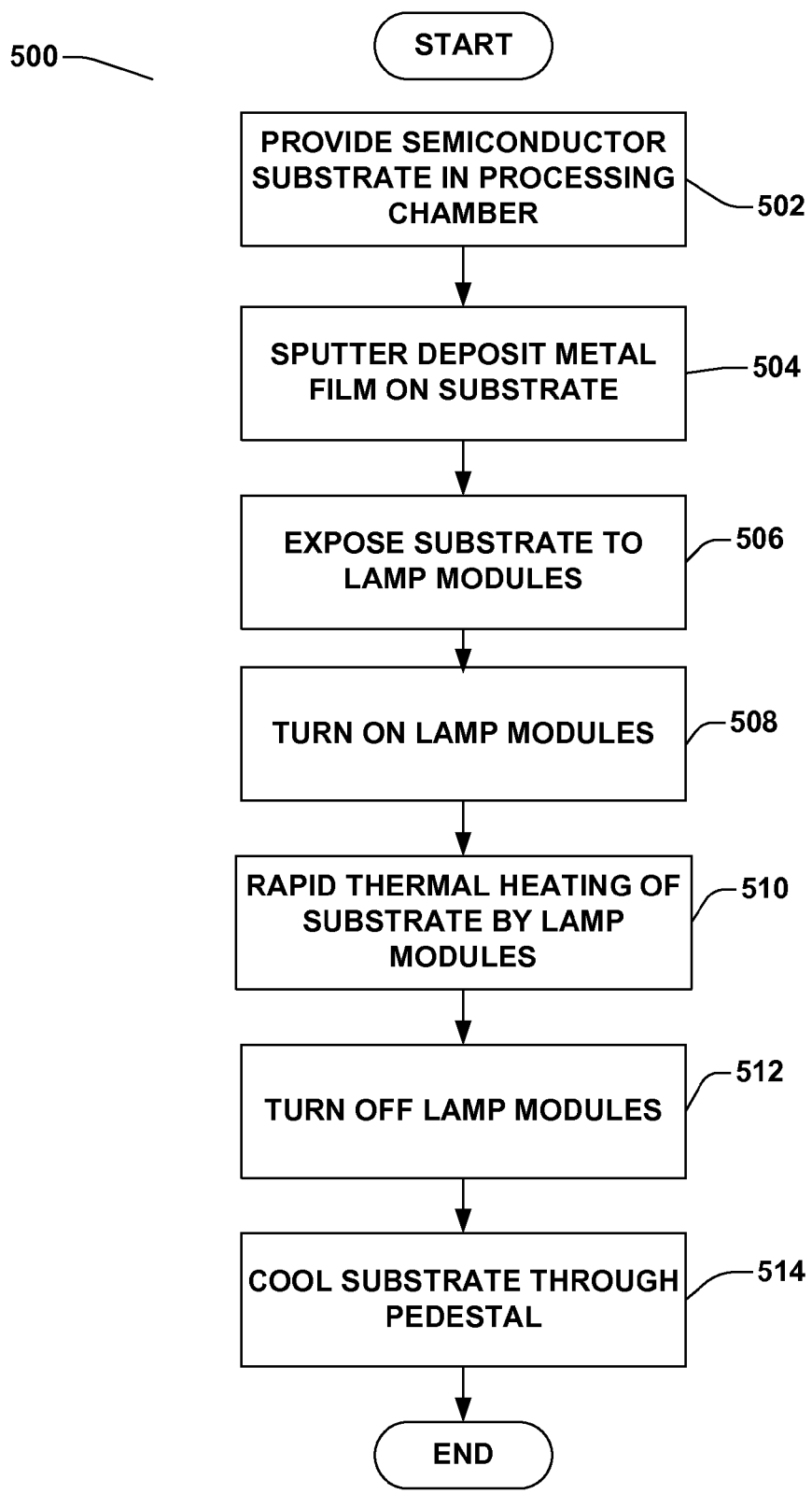
FIG. 5 illustrates a flow diagram of some embodiments of a method for heating a semiconductor substrate in a physical vapor deposition system.

FIG. 5 illustrates a flow diagram of some embodiments of a method 500 for heating a semiconductor substrate in a physical vapor deposition chamber having one or more lamp modules. While method 500 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 502 a semiconductor substrate is provided in a physical vapor deposition chamber having a target configured to provide target atoms to a substrate supported on a pedestal. Target is positioned in opposition to the substrate to be sputtered.

At step 504 a metal film is formed on the substrate by target atoms generated by application of a bias to the target that causes high energy ions from a plasma in the chamber to sputter the target. Target atoms condense on the substrate to form a thin film.

At 506 substrate is exposed to lamp modules. Exposure of the substrate to the one or more lamp modules may occur by movement of the shielding device, movement of the pedestal, reflecting light energy emitted by the lamp modules onto the substrate, or positioning a transfer arm having lamp modules mounted thereto over the substrate.

At step 508 lamp modules are turned on. Light energy emitted by lamp modules may be controlled by a power controller used to increase or decrease the light energy being emitted by the lamps.

At step 510 rapid thermal heating of the substrate by light energy emitted from the lamp modules causes metal film to reflow, thereby promoting the flow of metal film into holes in the substrate formed to provide interconnect features between layers in the substrate.

After some predetermined time, at 512 lamp modules are turned off. The substrate is then cooled by flow of a cooling liquid through a conduit in the pedestal at 514.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a physical vapor deposition system configured to heat a semiconductor substrate or wafer to improve gap fill, and an associated method.

In some embodiments, the present disclosure relates to a method for heating a substrate in a physical vapor deposition process chamber. The method comprises supporting a substrate on a pedestal housed within a process chamber. The method further comprises forming target atoms on a surface of the substrate. The method further comprises heating the surface of the substrate using a radiant heat source during or after forming the target atoms on the surface.

In other embodiments, the present disclosure relates to a method for heating a semiconductor substrate in a physical vapor deposition process chamber. The method comprises supporting a semiconductor substrate on a pedestal housed within a process chamber comprising a shielding device operable to thermally separate a radiant heat source from the semiconductor substrate. The method further comprises depositing target atoms onto a surface of the semiconductor substrate. The method further comprises exposing the surface of the semiconductor substrate to the radiant heat source during or after depositing the target atoms onto the surface, wherein the radiant heat source comprises one or more lamp modules.

In other embodiments, the present disclosure relates to a method for heating a semiconductor substrate in a physical vapor deposition process chamber. The method comprises supporting a semiconductor substrate on a pedestal housed within a process chamber. The method further comprises depositing target atoms onto a surface of the semiconductor substrate. The method further comprises heating the surface of the semiconductor substrate using a radiant heat source after deposition of the target atoms. The method further comprises providing a shielding device at a first position that blocks energy from the radiant heat source from reaching the surface of the semiconductor substrate during depositing the target atoms onto the surface. The method further comprises providing the shielding device at a second position that enables energy from the radiant heat source to reach the surface of the semiconductor substrate after depositing the target atoms onto the surface.

What is claimed is:

1. A method for heating a substrate in a physical vapor deposition process chamber, comprising:
   supporting a substrate on a pedestal housed within a process chamber, wherein the substrate has a lower surface contacting an upper surface of the pedestal;
   forming target atoms on a surface of the substrate opposing the lower surface; and heating the surface of the substrate using a radiant heat source facing the surface of the substrate, wherein the radiant heat source is configured to generate radiant heat that reaches the surface of the substrate prior to reaching the lower surface of the substrate during or after forming the target atoms on the surface.

2. The method of claim 1, further comprising:
   providing a shielding device at a first position that blocks energy from the radiant heat source from reaching the surface of the substrate before forming the target atoms on the surface; and
   moving the shielding device to a second position that enables the energy from the radiant heat source to reach the surface of the substrate during or after forming the target atoms onto the surface.

3. The method of claim 2, further comprising:
   returning the shielding device from the second position back to the first position while the substrate is on the pedestal and after the target atoms have been formed onto the surface of the substrate.

4. The method of claim 1, further comprising:
   cooling the substrate by reducing a temperature of the pedestal after forming the target atoms on the surface of the substrate is completed.

5. The method of claim 1, further comprising:
   moving the pedestal from a first position in which the substrate is thermally separated from the radiant heat source to a second position in which the surface of the substrate is exposed to the radiant heat source.

6. The method of claim 5, further comprising:
   returning the pedestal from the second position back to the first position; and
   cooling the substrate by reducing a temperature of the pedestal after the pedestal has been returned to the first position.

7. The method of claim 1, further comprising:
   directing the radiant heat onto the surface of the substrate concurrent to forming the target atoms on the surface of the substrate.

8. A method for heating a semiconductor substrate in a physical vapor deposition process chamber, comprising:
   supporting a semiconductor substrate on a pedestal housed within a process chamber comprising a shielding device operable to thermally separate a radiant heat source from the semiconductor substrate, wherein the semiconductor substrate has a lower surface contacting an upper surface of the pedestal;
   depositing target atoms onto a surface of the semiconductor substrate opposing the lower surface; and
   exposing the surface of the semiconductor substrate to the radiant heat source, wherein the radiant heat source is configured to generate radiant heat that reaches the surface of the substrate prior to reaching the lower surface during or after depositing the target atoms onto the surface and wherein the radiant heat source comprises one or more lamp modules.

9. The method of claim 8, further comprising:
directing the radiant heat onto the surface of the semiconductor substrate concurrent to depositing the target atoms onto the surface of the semiconductor substrate.

10. The method of claim 8, further comprising:
providing the shielding device at a first position that blocks energy from the radiant heat source from reaching the surface of the semiconductor substrate during depositing the target atoms onto the surface;
moving the shielding device to a second position that enables the energy from the radiant heat source to reach the surface of the semiconductor substrate after depositing the target atoms onto the surface; and
returning the shielding device from the second position back to the first position while the semiconductor substrate is on the pedestal and after the target atoms have been form onto the surface of the semiconductor substrate.

11. The method of claim 10, further comprising:
cooling the semiconductor substrate by reducing a temperature of the pedestal after the shielding device has been returned to the first position.

12. The method of claim 8, further comprising:
moving the pedestal from a first position in which the semiconductor substrate is thermally separated from the radiant heat source to a second position in which the surface of the semiconductor substrate is exposed to the radiant heat source after depositing the target atoms onto the surface;
returning the pedestal from the second position back to the first position; and
cooling the semiconductor substrate by reducing a temperature of the pedestal after the pedestal has been returned to the first position.

13. The method of claim 8, further comprising:
operating the shielding device to prevent the deposition of the target atoms onto the radiant heat source during depositing the target atoms onto the surface of the semiconductor substrate.

14. A method for heating a semiconductor substrate in a physical vapor deposition process chamber, comprising:
supporting a semiconductor substrate on a pedestal housed within a process chamber, wherein the semiconductor substrate has a lower surface contacting an upper surface of the pedestal;
depositing target atoms onto a surface of the semiconductor substrate opposing the lower surface;
providing a shielding device at a first position that blocks energy from a radiant heat source from reaching the surface of the semiconductor substrate during prior to depositing the target atoms onto the surface; and
providing the shielding device at a second position that enables the energy from the radiant heat source to reach the surface of the semiconductor substrate during or after depositing the target atoms onto the surface; and
wherein the radiant heat source is configured to generate the energy, and wherein the energy reaches the surface of the semiconductor substrate prior to reaching the lower surface during or after depositing the target atoms on the surface.

15. The method of claim 14, wherein providing the shielding device at the second position comprises moving the shielding device from the first position to the second position.

16. The method of claim 15, further comprising:
returning the shielding device from the second position back to the first position while the semiconductor substrate is on the pedestal and after the target atoms have been deposited onto the surface of the semiconductor substrate; and
cooling the semiconductor substrate by reducing a temperature of the pedestal after the shielding device has been returned to the first position.

17. The method of claim 15,
wherein the shielding device comprises an upper portion and a lower portion; and
wherein a separation between the upper portion and the lower portion is different in the first position than in the second position.

18. The method of claim 15, further comprising:
cooling the semiconductor substrate by reducing a temperature of the pedestal after forming the target atoms on the surface of the semiconductor substrate is completed.

19. The method of claim 8, wherein the radiant heat source is positioned vertically between the pedestal and a target used to form the target atoms concurrent to depositing the target atoms on the surface of the semiconductor substrate.

20. The method of claim 14, wherein the radiant heat source is positioned between the pedestal and a target used to form the target atoms concurrent to depositing the target atoms on the surface of the semiconductor substrate.

\* \* \* \* \*